United States Patent
Lages et al.

(10) Patent No.: US 10,829,067 B2
(45) Date of Patent: Nov. 10, 2020

(54) ELECTRICAL LOAD MANAGEMENT METHOD AND APPARATUS

(71) Applicant: Jaguar Land Rover Limited, Coventry (GB)

(72) Inventors: Fernando Lages, Coventry (GB); Stephen Pickering, Coventry (GB)

(73) Assignee: JAGUAR LAND ROVER LIMITED, Warwickshire (GB)

( * ) Notice: Subject to any disclaimer, the term of this patent is extended or adjusted under 35 U.S.C. 154(b) by 46 days.

(21) Appl. No.: 16/072,102

(22) PCT Filed: Mar. 14, 2017

(86) PCT No.: PCT/EP2017/056020
§ 371 (c)(1),
(2) Date: Jul. 23, 2018

(87) PCT Pub. No.: WO2017/162490
PCT Pub. Date: Sep. 28, 2017

(65) Prior Publication Data
US 2019/0023203 A1 Jan. 24, 2019

(30) Foreign Application Priority Data
Mar. 25, 2016 (GB) .................................. 1605141.9

(51) Int. Cl.
*B60R 16/033* (2006.01)
*H02J 1/14* (2006.01)
(Continued)

(52) U.S. Cl.
CPC ............ *B60R 16/033* (2013.01); *B60L 58/20* (2019.02); *B60L 58/25* (2019.02); *B60R 16/03* (2013.01);
(Continued)

(58) Field of Classification Search
CPC ...... B60L 2210/10; B60L 58/20; B60L 58/25; B60R 16/03; B60R 16/033;
(Continued)

(56) References Cited

U.S. PATENT DOCUMENTS 10,179,507 B2 * 1/2019 Terayama ............. B60W 20/13
2002/0113441 A1 8/2002 Obayashi
(Continued)

OTHER PUBLICATIONS

Patents Act 1977: Search Report under Section 17, UKIPO Application No. GB1605141.9, dated Aug. 25, 2016, 4 pp.
(Continued)

*Primary Examiner* — Michael J Huntley
(74) *Attorney, Agent, or Firm* — Miller Nash Graham & Dunn LLP

(57) ABSTRACT

An electrical load management system for a vehicle power supply system having a high voltage network and a low voltage network coupled to each other by a DC-DC converter includes a controller for controlling one or more high voltage vehicle electrical systems connected to the high voltage network and one or more low voltage vehicle electrical systems connected to the low voltage network. The controller has at least one processor that receives command signals for the high and low voltage vehicle electrical systems, and a memory device having instructions stored therein. The at least one processor is configured to determine a first electrical load on the high voltage network and a second electrical load on the low voltage network in dependence on the command signals and to control operation of the high and low voltage vehicle electrical systems in dependence on the determined first and second electrical loads.

20 Claims, 2 Drawing Sheets

(51) Int. Cl.
*H02J 7/14* (2006.01)
*B60R 16/03* (2006.01)
*B60L 58/20* (2019.01)
*B60L 58/25* (2019.01)
*G01R 19/25* (2006.01)
*H02J 1/08* (2006.01)

(52) U.S. Cl.
CPC ............ *G01R 19/2513* (2013.01); *H02J 1/14* (2013.01); *H02J 7/1423* (2013.01); *B60L 2210/10* (2013.01); *H02J 1/082* (2020.01); *Y02T 10/7005* (2013.01); *Y02T 10/92* (2013.01)

(58) Field of Classification Search
CPC .. G01R 19/2513; H02J 1/14; H02J 2001/008; H02J 7/1423; Y02T 10/7005; Y02T 10/92
See application file for complete search history.

(56) References Cited

U.S. PATENT DOCUMENTS

| | | |
|---|---|---|
| 2002/0140397 A1 | 10/2002 | Hasegawa et al. |
| 2007/0032915 A1 | 2/2007 | Yamaguchi |
| 2007/0141999 A1 | 6/2007 | Przywecki |
| 2011/0202197 A1 | 8/2011 | Hachiya et al. |
| 2011/0218698 A1* | 9/2011 | Bissontz ............... B60L 50/00 701/22 |
| 2012/0019058 A1* | 1/2012 | Goodermuth ....... B60L 15/2045 307/9.1 |
| 2013/0249280 A1* | 9/2013 | Goodermuth ....... B60L 15/2045 307/9.1 |
| 2013/0249468 A1* | 9/2013 | Bajjuri ................ F02N 11/0825 320/104 |
| 2014/0265560 A1* | 9/2014 | Leehey ................... B60L 58/13 307/10.1 |
| 2015/0298572 A1* | 10/2015 | Sisk ........................ B60L 1/00 701/22 |
| 2015/0353036 A1* | 12/2015 | Pierce ................... B60R 16/033 307/9.1 |
| 2016/0137092 A1* | 5/2016 | Thieme ............... F02N 11/0866 307/10.6 |
| 2017/0033594 A1* | 2/2017 | Rozman ................. H02J 9/061 |

OTHER PUBLICATIONS

International Search Report and Written Opinion of the International Searching Authority, International Application No. PCT/EP2017/056020, dated Jun. 9, 2017, 17 pp.

* cited by examiner

ELECTRICAL LOAD MANAGEMENT METHOD AND APPARATUS

RELATED APPLICATIONS

This application is a 35 U.S.C. § 371 national stage application of PCT Application No. PCT/EP2017/056020, filed on Mar. 14, 2017, which claims priority from Great Britain Patent Application No. 1605141.9, filed on Mar. 25, 2016, the contents of which are incorporated herein by reference in their entireties. The above-referenced PCT International Application was published in the English language as International Publication No. WO 2017/162490 A1 on Sep. 28, 2017.

TECHNICAL FIELD

The present disclosure relates to an electrical load management method and apparatus. More particularly, but not exclusively, the present disclosure relates to an electrical load management system for a vehicle power supply; to a vehicle incorporating an electrical load management system; to a method of managing electrical load on a vehicle power supply system and to a non-transitory computer readable media.

BACKGROUND

The number of electrically operated systems in vehicles continues to increase, particularly in luxury vehicles. There are increasing demands on the fuel efficiency of vehicles in order to reduce emissions. There is a conflict between these requirements since the energy required to power vehicle electrical systems is still commonly derived from the combustion of fuel to drive an electrical generator. The state of the art response to these requirements has been to provide a high voltage network in the vehicle, primarily to aid in hybridized functions such as stop-start and torque assist or to provide dedicated electrical drive. The high voltage network may, for example, operate at 42V or 48V. The high voltage network includes a high voltage generator, but there is no low voltage generator. Since a low voltage network is also required, typically operating at 12V, the use of a DC-DC converter is required. This is typically an expensive component and its cost increases according to the available power. Moreover, packaging the DC-DC converter may prove problematic.

The implementation of a dual-voltage electrical system presents particular challenges in managing the electrical load on each network. In existing load management systems for a single voltage network, it is known to manage the electrical loads according to a number of parameters. The amount of current available and the current required to operate a specific electrical load are determined to ascertain whether it is feasible to sustain operation of a particular vehicle electrical system. The load management system may manage a group of loads for which operational feasibility is calculated in a predetermined order of priority.

The known load management systems are not suitable for managing electrical loads on a dual-voltage electrical system. For example, in the arrangement described above where the high and low voltage networks are connected by a DC-DC converter, the system may behave in a non-linear manner due to saturation of the DC-DC converter.

It is against this backdrop that the present invention has been conceived. At least in certain embodiments, the present invention seeks to address or ameliorate at least some of the shortcomings associated with known electrical load management systems.

SUMMARY OF THE INVENTION

Aspects of the present invention relate to an electrical load management system; to a vehicle; to a method of managing electrical load and to a non-transitory computer readable media as claimed in the appended claims.

According to a further aspect of the present invention there is provided an electrical load management system for a vehicle power supply system having a high voltage network and a low voltage network coupled to each other by a DC-DC converter, wherein the electrical load management system comprises:

a controller for controlling one or more high voltage vehicle electrical system connected to said high voltage network and one or more low voltage vehicle electrical system connected to said low voltage network;

the controller comprising at least one processor for receiving command signals for said high and low voltage vehicle electrical systems;

a memory device having instructions stored therein and coupled to the at least one processor;

wherein the at least one processor is configured to determine a first electrical load on said high voltage network and a second electrical load on said low voltage network in dependence on said command signals; and to control operation of the high and low voltage vehicle electrical systems in dependence on the determined first and second electrical loads. The electrical load management system manages the power supply for a plurality of networks having different operating voltages. The electrical load management system controls the connection of vehicle electrical systems to the high and low voltage networks. The electrical load on said high and low voltage networks is thereby controlled within predefined parameters.

The high and low voltage vehicle electrical systems may each have a predefined electrical load value; and the at least one processor may be configured to determine the first and second electrical loads in dependence on said predefined electrical load values. The at least one processor may reference command signals to determine the status of each of the high and low voltage vehicle electrical systems. The at least one processor may be configured to receive the predefined electrical load value from a control module associated with said high and low voltage vehicle electrical systems.

The predefined electrical load values can be stored in a look-up table which is accessible to said at least one processor. The at least one processor may be configured to determine the first and second electrical loads in dependence on the determined electrical load values of each vehicle electrical system.

The high and low voltage vehicle electrical systems may each have a priority rating. The priority ratings may be used to control activation and/or de-activation of the high and low voltage vehicle electrical systems. The priority ratings may define an activation sequence and/or a deactivation sequence for said high and low voltage vehicle electrical systems. The at least one processor may control activation and/or deactivation of said high and low voltage vehicle electrical systems in dependence on said priority ratings. The priority rating of each vehicle electrical system may be defined irrespective of whether it is on the high voltage network or the low voltage network. The priority ratings may be defined universally for said high voltage vehicle electrical systems and said low voltage vehicle electrical systems, for example in a common look-up table. The at least one processor may be configured to activate and/or to deactivate both said high voltage vehicle electrical systems and said low voltage vehicle electrical systems in dependence on said universal priority ratings. The priority ratings may be predefined for each high and low voltage vehicle electrical system. The priority ratings for said high voltage vehicle electrical systems and said low voltage vehicle electrical systems may be stored in a look-up table which can be accessed by the processor.

The electrical load values of the said high and low voltage vehicle electrical systems may be power ratings. The use of a power rating avoids the need to compensate for the different operating voltages of the high and low voltage networks. Alternatively, the electrical load values may be current ratings.

The high voltage network may have a first maximum power load and the low voltage network may have a second maximum power load; the at least one processor may be configured to control operation of said high and low voltage vehicle electrical systems such that the first and second electrical loads are less than or equal to said first and second maximum power loads respectively.

The at least one processor may be configured to determine when the DC-DC converter is saturated; and may control operation of said high and low voltage vehicle electrical systems in dependence on the determined first and second electrical loads when the DC-DC converter is saturated. The at least one processor may control the high and low voltage vehicle electrical systems in dependence on limitations of the high voltage network when the DC-DC converter is un-saturated.

The high and low voltage vehicle electrical systems may be categorized as manageable and unmanageable. The unmanageable vehicle electrical systems are those systems which are essential to operation of the vehicle and, as such, must remain operable. The manageable vehicle electrical systems are not essential to operation of the vehicle and may be selectively controlled (i.e. activated/de-activated) by said at least one processor to manage the electrical loads on the high and low voltage networks. The at least one processor may be configured to control the manageable high and low voltage vehicle electrical systems to maintain or enable operation of the unmanageable high and low voltage vehicle electrical systems. For example, the at least one processor may de-activate one or more manageable high and low voltage vehicle electrical systems to enable activation of one or more unmanageable high and low voltage vehicle electrical systems.

The at least one processor may be configured to control operation of each of the high and low voltage vehicle electrical systems by applying one of the following control strategies:
  activate/de-activate the high and low voltage vehicle electrical systems;
  operate the high and low voltage vehicle electrical systems at a predetermined intermediate power setting; and
  vary the power setting of the high and low voltage vehicle electrical systems in dependence on the electrical load on the related network.

One of the low voltage vehicle electrical systems may be a low voltage battery, and the at least one processor may be configured to control charging of said low voltage battery. A charging current may be supplied to ensure that the low voltage battery remains charged to a predetermined level. The at least one processor may receive a battery signal from a battery management system coupled to said low voltage battery.

One of the high voltage vehicle electrical systems may be a high voltage battery, and the at least one processor may be configured to control charging of said high voltage battery.

One or more electrical generator may be connected to the high voltage network. For example, a regenerative braking system may be connected to the high voltage network.

According to a further aspect of the present invention there is provided a vehicle comprising an electrical load management system as described herein.

According to a still further aspect of the present invention there is provided a method of managing electrical load on a vehicle power supply system having a high voltage network and a low voltage network coupled to each other by a DC-DC converter, the method comprising:
  controlling one or more high voltage vehicle electrical system connected to said high voltage network and one or more low voltage vehicle electrical system connected to said low voltage network;
  receiving command signals for said high and low voltage vehicle electrical systems;
  determining a first electrical load on said high voltage network and a second electrical load on said low voltage network in dependence on said command signals; and
  controlling operation of the high and low voltage vehicle electrical systems in dependence on the determined first and second electrical loads.

The method may comprise determining the first and second electrical loads in dependence on electrical load values defined for each of said high and low voltage vehicle electrical systems.

The method may comprise receiving the predefined electrical load values from a control module associated with each said high and low voltage vehicle electrical systems.

The high and low voltage vehicle electrical systems may each have a priority rating. The method may comprise activating and/or de-activating said high and low voltage vehicle electrical systems in dependence on said priority ratings. The priority ratings may define an activation sequence and/or a deactivation sequence for said high and low voltage vehicle electrical systems. The priority rating of each vehicle electrical system may be defined irrespective of whether it is on the high voltage network or the low voltage network. The priority ratings may be defined universally for said high voltage vehicle electrical systems and said low voltage vehicle electrical systems, for example in a common look-up table. The method may comprise activating and/or deactivating both said high voltage vehicle electrical systems and said low voltage vehicle electrical systems in dependence on said universal priority ratings. The priority ratings may be predefined for each high and low voltage vehicle electrical system.

The electrical load values of the said high and low voltage vehicle electrical systems may be power ratings.

The method may comprise controlling operation of said high and low voltage vehicle electrical systems such that the first and second electrical loads are less than or equal to first and second maximum power loads defined for said high and low voltage networks respectively.

The method may comprise controlling operation of said high and low voltage vehicle electrical systems in dependence on the determined first and second electrical loads when the DC-DC converter is saturated. The method may comprise controlling the high and low voltage vehicle electrical systems in dependence on limitations of the high voltage network when the DC-DC converter is un-saturated.

The high and low voltage vehicle electrical systems may be categorized as manageable and unmanageable. The method may comprise prioritising operation of the unmanageable high and low voltage vehicle electrical systems over the manageable high and low voltage vehicle electrical systems.

The high and low voltage vehicle electrical systems may each have a priority rating for activation and/or de-activation. The priority rating may be predefined for each high and low voltage vehicle electrical systems. The method may comprise controlling operation of each of the high and low voltage vehicle electrical systems in dependence on the predefined priority ratings.

The method may comprise controlling operation of each of the high and low voltage vehicle electrical systems by applying one of the following control strategies:
- activate/de-activate the high and low voltage vehicle electrical systems;
- operate the high and low voltage vehicle electrical systems at a predetermined intermediate power setting; and
- vary the power setting of the high and low voltage vehicle electrical systems in dependence on the electrical load on the related network.

One of the low voltage vehicle electrical systems may be a low voltage battery. The method may comprise controlling charging of said low voltage battery.

One of the high voltage vehicle electrical systems may be a high voltage battery. The method may comprise controlling charging of said high voltage battery.

According to a still further aspect of the present invention there is provided a non-transitory computer readable media comprising a set of computational instructions which, when executed, cause a computer to implement the method described herein.

Any controller or controllers described herein may suitably comprise a control unit or computational device having one or more electronic processors. Thus the system may comprise a single control unit or electronic controller or alternatively different functions of the controller may be embodied in, or hosted in, different control units or controllers. As used herein the term "controller" or "control unit" will be understood to include both a single control unit or controller and a plurality of control units or controllers collectively operating to provide any stated control functionality. To configure a controller, a suitable set of instructions may be provided which, when executed, cause said control unit or computational device to implement the control techniques specified herein. The set of instructions may suitably be embedded in said one or more electronic processors. Alternatively, the set of instructions may be provided as software saved on one or more memory associated with said controller to be executed on said computational device. A first controller may be implemented in software run on one or more processors. One or more other controllers may be implemented in software run on one or more processors, optionally the same one or more processors as the first controller. Other suitable arrangements may also be used.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all embodiments and/or features of any embodiment can be combined in any way and/or combination, unless such features are incompatible. The applicant reserves the right to change any originally filed claim or file any new claim accordingly, including the right to amend any originally filed claim to depend from and/or incorporate any feature of any other claim although not originally claimed in that manner.

BRIEF DESCRIPTION OF THE DRAWINGS

One or more embodiments of the present invention will now be described, by way of example only, with reference to the accompanying figures, in which.

DETAILED DESCRIPTION

An electrical load management system 1 in accordance with an embodiment of the present invention will now be described with reference to FIGS. 1 and 2. The electrical load management system 1 is a dual-voltage system for use in a power supply system PSS comprising a plurality of networks having different operating voltages.

Figure 1:
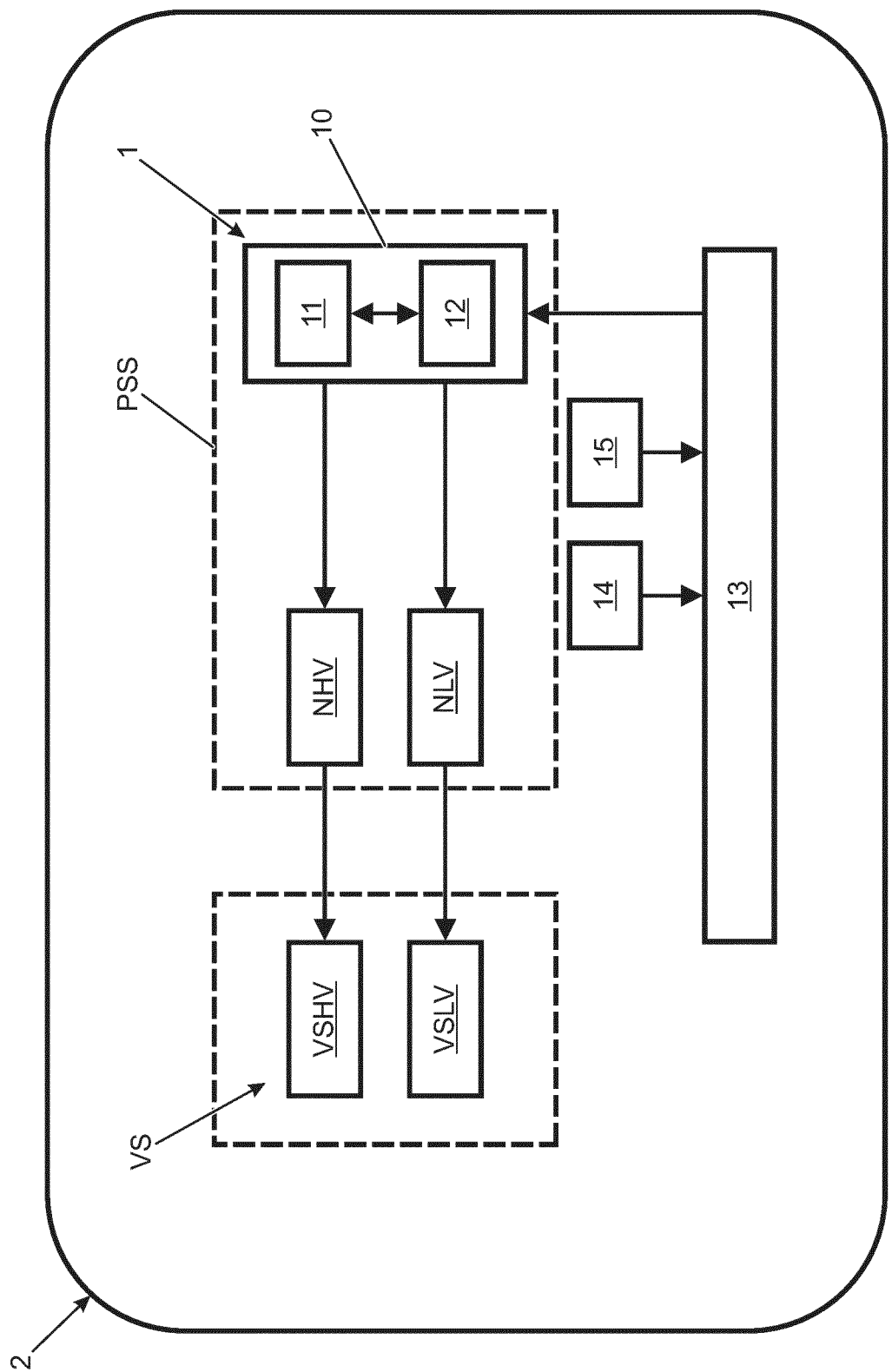
FIG. 1 is a schematic representation of a vehicle incorporating an electrical load management system in accordance with an embodiment of the present invention.

As shown in FIG. 1, the electrical load management system 1 in the present embodiment is installed in a vehicle 2 and is operative to control on-board vehicle electrical systems (denoted generally by the reference VS). At least in certain embodiments, the electrical load management system 1 is configured selectively to activate and de-activate said vehicle electrical systems VS. The vehicle 2 illustrated in FIG. 1 is an automobile or a sports utility vehicle (SUV), but the electrical load management system 1 can be installed in other types of vehicle.

Figure 2:
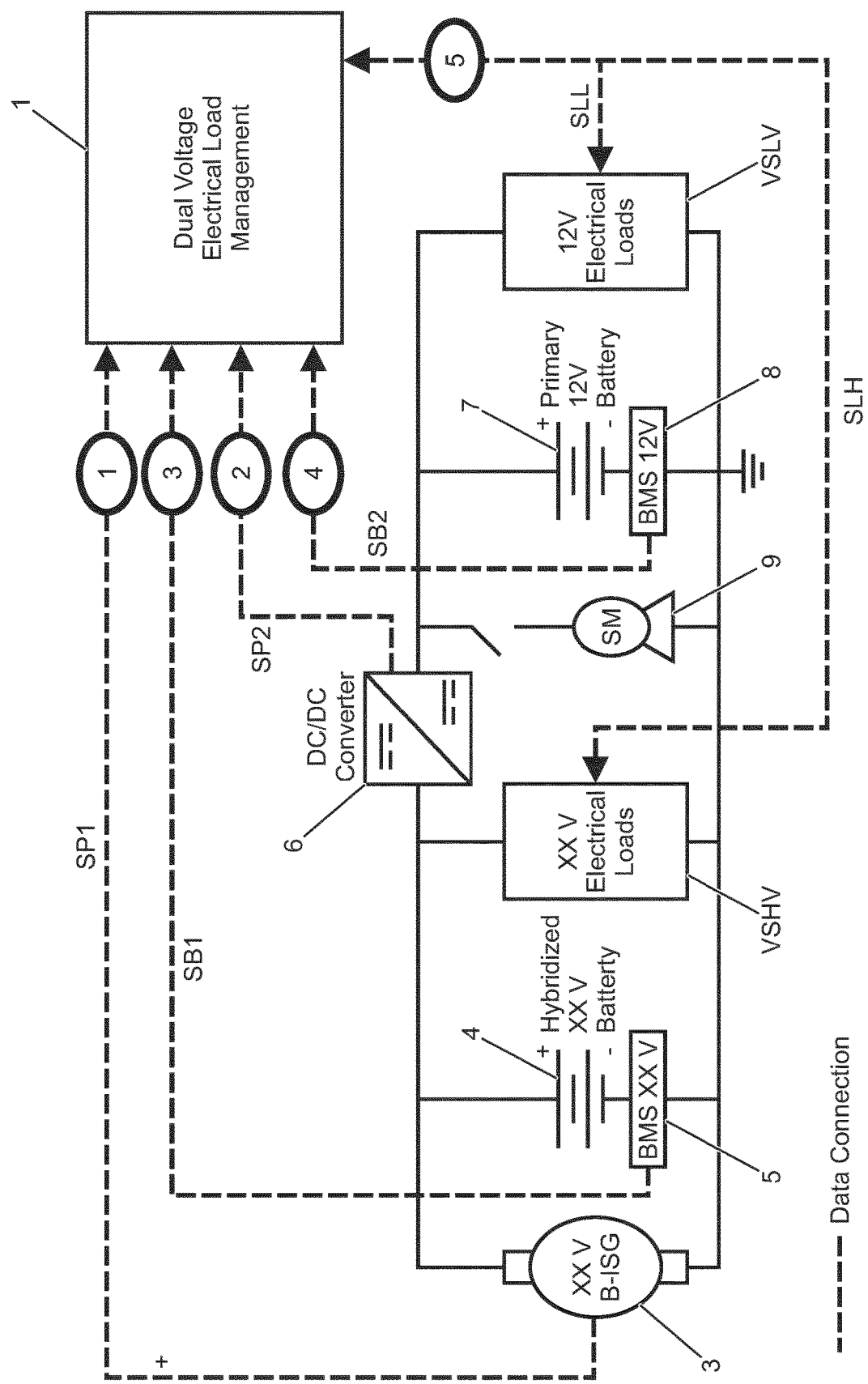
FIG. 2 is a system diagram representing the integration of the electrical load management system with high and low voltage networks.

As shown in FIG. 2, the vehicle electrical systems VS comprise high voltage vehicle electrical systems VSHV and low voltage vehicle electrical systems VSLV. The low voltage vehicle electrical systems VSLV include a heated rear screen, a heated front screen, one or more heated or climate seat, a heated steering wheel, a heated wiper pack, and a heated side mirror. One or more of these low voltage vehicle electrical systems VSLV may be transferred to the high voltage network. The high voltage vehicle electrical systems VSHV are connected to a high voltage network NHV and the low voltage vehicle electrical systems VSLV are connected to a low voltage network NLV. In the present embodiment the low voltage network NLV is a 12V network and the high voltage network NHV is a 48V network. It will be understood that the high and low voltage networks NHV, NLV may operate at voltages other than 12V and 48V respectively. The high voltage network NHV is connected to a belt integrated starter generator (BISG) 3 which is the primary source of electrical power. A high voltage battery 4 is connected to the high voltage network NHV. A first battery monitoring system 5 is provided for monitoring the status of the high voltage battery 4. The low voltage network NLV is coupled to the high voltage network NHV by a DC-DC converter 6 which functions as a secondary power supply. The low voltage network NLV is connected to a low voltage battery 7, typically a 12V battery. A second battery monitoring system 8 is provided for monitoring the status of the low voltage battery 7. The low voltage battery 7 is connected to a starter motor 9 for starting an internal combustion engine.

As shown in FIG. 1, the electrical load management system 1 comprises a controller 10 for controlling operation of both the high voltage vehicle electrical systems VSHV and the low voltage vehicle electrical systems VSLV. The controller 10 comprises an electronic processor 11 and a memory device 12. A set of computational instructions is stored on the memory device 12. When executed, the computational instructions cause the electronic processor 11 to perform the method(s) described herein. The electronic processor 11 is connected to a vehicle communication bus 13, such as a CAN bus, to identify command signals requesting activation of the vehicle electrical systems VS. The vehicle electrical systems VS may be activated manually. For example, the aforementioned low voltage vehicle electrical systems VSLV may be activated by a user input via a human machine interface 14. The human machine interface 14 may comprise an interface apparatus, such as a touch screen or a switch. The human machine interface 14 publishes a command signal to the vehicle communication bus 13 in dependence on a user input. Alternatively, or in addition, the vehicle electrical systems VS may be activated automatically or semi-automatically. For example, activation of the heated front screen may be controlled in dependence on a driver input or if screen misting is detected.

The high and low voltage vehicle electrical systems VSHL, VSLV are categorised as either manageable or unmanageable. The unmanageable vehicle electrical systems VS are primary systems which are essential for the operation of the vehicle, such as power steering, braking systems, external lighting systems, etc. The manageable vehicle electrical systems VS are secondary systems which are non-essential for the operation of the vehicle 2. The manageable vehicle electrical systems may relate to comfort loads in the vehicle 2, for example those systems relating to occupant comfort which can be activated/de-activated without affecting operation of the vehicle 2. As described herein, the manageable vehicle electrical systems VS are selectively controlled by the electrical load management system 1, whereas the unmanageable vehicle electrical systems VS are outside the remit of the electrical load management system 1. The unmanageable vehicle electrical systems VS are prioritised over the manageable vehicle electrical systems VS. The electrical load management system 1 has particular application in controlling operation of the manageable vehicle electrical systems VS. In the present embodiment, the electrical load management system 1 controls operation of the manageable vehicle electrical systems VS to ensure that there is sufficient load capacity on said high and low voltage networks NHV, NLV for operation of said unmanageable vehicle electrical systems VS. Unless specified otherwise, the vehicle electrical systems VS referenced herein are the manageable vehicle electrical systems VS which are controlled by the electrical load management system 1.

The integration of the electrical load management system 1 with the high and low voltage networks NHV, NLV is illustrated in FIG. 2. The electronic processor 11 receives first and second power signals SP1, SP2 from the belt integrated starter generator 3 and the DC-DC converter 6. The first and second power signals SP1, SP2 comprise actual and available power information for the belt integrated starter generator 3 and the DC-DC converter 6 respectively. The electronic processor 11 also receives first and second battery signals SB1, SB2 from the first and second battery monitoring systems 5, 8 respectively. The first and second battery signals SB1, SB2 comprise State of Charge (SOC) and current IN/OUT information for the high voltage battery 4 and the low voltage battery 7 respectively. The electronic processor 11 also receives high and low electrical load signals SLH, SLL for the high and low voltage networks NHV, HLV respectively. The high and low electrical load signals SLH, SLL comprise electrical load status and command information for the high and low voltage networks NHV, NLV respectively. The command information relates to all of the vehicle electrical systems VS which are currently active on the high and low voltage networks NHV, NLV, i.e. both the manageable and unmanageable vehicle electrical systems VS.

In the present embodiment the belt integrated starter generator 3 is capable of generating sufficient current to saturate the DC-DC converter 6. The DC-DC converter 6 is determined to be saturated when the demand current is substantially equal to the maximum capacity of the DC-DC converter 6 and the actual current of the DC-DC converter 6 is equal to the maximum current. In order to determine that the DC-DC converter 6 is saturated and to avoid high frequency signal switching, a hysteresis block is implemented. The electronic processor 11 determines that the DC-DC converter 6 is saturated only if the available current is substantially equal to the actual current plus an offset (which may be calibrated); and the DC-DC physical limit minus an offset is less than the available current. The electronic processor 11 will reset the saturated condition when the actual current drops with relation to the available current. The electronic processor 11 implements a dual-voltage control strategy to manage the power available from the belt integrated starter generator 3 and from the DC-DC converter 6. The electronic processor 11 determines the required current to activate and sustain operation of the high voltage vehicle electrical systems VSHV on the high voltage network NHV; and the required current to activate and sustain operation of the low voltage vehicle electrical systems VSLV on the low voltage network NLV. The actual current is the current various high and low voltage vehicle electrical systems VSHV, VSLV are presently consuming. The available current is the result of the subtraction of the actual current being consumed from the maximum available current. In the present embodiment, the available current for the belt integrated starter generator (BISG) 3 differs from the available current for the DC-DC converter 6. The activation of the high and low voltage vehicle electrical systems VSHV, VSLV is then controlled in dependence on the available current on the high and low voltage networks NHV, NLV.

The electronic processor 11 manages the vehicle electrical systems VS in dependence on a predetermined order of priority. In particular, a predefined priority rating is defined for each of the vehicle electrical systems VS on said high voltage network NHV and on said low voltage network NLV. The priority rating is defined irrespective of whether the vehicle electrical system VS is associated with the high voltage network NHV or the low voltage network NLV. The priority ratings for both the high and low voltage vehicle electrical systems VSHV, VSLV are defined together in a look-up table T1 stored on the memory device 12. The look-up table T1 thereby provides a universal summary of the priority ratings of the vehicle electrical systems VS which can be accessed by the electronic processor 11 to enable control of the vehicle electrical systems VS. The vehicle electrical systems VS having a higher priority rating are prioritised over vehicle electrical systems VS having a lower priority rating.

As outlined herein, the DC-DC converter 6 is capable of providing only a limited power supply for the low voltage network NLV. For the purposes of illustrating the present invention, the DC-DC converter 6 in the present embodiment may be considered to supply a maximum power of 3 kW before saturation. The power supplied by the DC-DC converter 6 is typically insufficient to meet the power requirements of all the of the vehicle electrical systems VS on the low voltage network NLV. The electronic processor 11 is configured to control activation and/or deactivation of the low voltage vehicle electrical system VSLV in dependence on the predefined priority ratings. A low voltage vehicle electrical system VSLV having a higher priority rating is activated before a low voltage vehicle electrical system VSLV having a lower priority rating. Conversely, a low voltage vehicle electrical system VSLV having a higher priority rating is de-activated after a low voltage vehicle electrical system VSLV having a lower priority rating. When the DC-DC converter 6 is saturated, in dependence on the priority ratings, one or more active low voltage vehicle electrical system VSLV may be disabled; or the activation of a requested low voltage vehicle electrical system VSLV may be inhibited The high voltage network NHV delivers power to the high voltage vehicle electrical systems VSHV. The power supplied over the high voltage network NHV is insufficient to meet the power requirements of all the of the vehicle electrical systems VS on the high voltage network NHV. The electronic processor 11 is configured to control activation and/or deactivation of the high voltage vehicle electrical system VSHV in dependence on the predefined priority ratings. A high voltage vehicle electrical system VSHV having a higher priority rating is activated before a high voltage vehicle electrical system VSHV having a lower priority rating. Conversely, a high voltage vehicle electrical system VSHV having a higher priority rating is de-activated after a high voltage vehicle electrical system VSHV having a lower priority rating. When the high voltage network NHV is saturated, in dependence on the priority ratings, one or more active high voltage vehicle electrical system VSHV may be disabled; or the activation of a requested high voltage vehicle electrical system VSHV may be inhibited. It will be appreciated that the electronic processor 11 can be configured to control the high and low voltage vehicle electrical systems VSHV, VSLV in parallel. In certain embodiments, since the priority ratings for the high and low vehicle electrical systems VSHV, VSLV are defined in the same look-up table, the electronic processor 11 may be configured also to disable one or more active low voltage vehicle electrical system VSLV to enable operation of one or more high voltage electrical system VSHV having a higher priority rating. By removing the electrical load form the low voltage network NLV, the DC-DC converter 6 may be disabled to increase the available capacity on the high voltage network NLV.

By way of example, a look-up table T1 defining the priority rating of seventeen (17) vehicle electrical systems VS (labelled as systems A-Q) is provided below. The look-up table T1 identifies each of the vehicle electrical systems VS as being either high voltage vehicle electrical systems VSHV or low voltage vehicle electrical systems VSLV. In the illustrated arrangement the systems A, E, I, J, O are on the low voltage network NLV; and the systems B, C, D, F, G, H, K, L, M, N, P, Q are on the high voltage network NHV. The power consumption in kilowatts (kW) of each of the high and low voltage vehicle electrical systems VSHV, VSLV is also specified in the look-up table T1.

LOOK-UP TABLE T1

Priority Ratings for Vehicle Electrical Systems

| System | Priority | Power Requirement | LV | HV |
|--------|----------|-------------------|----|----|
| A | 3 | 1K | ✓ | x |
| B | 2 | 3K | x | ✓ |
| C | 1 | 1K | x | ✓ |
| D | 4 | 1K | x | ✓ |
| E | 17 | 1K | ✓ | x |
| F | 14 | 5K | x | ✓ |
| G | 12 | 7K | x | ✓ |
| H | 11 | 7K | x | ✓ |
| I | 13 | 1K | ✓ | x |
| J | 15 | 2K | ✓ | x |
| K | 16 | 5K | x | ✓ |
| L | 10 | 5K | x | ✓ |
| M | 9 | 8K | x | ✓ |
| N | 6 | 9K | x | ✓ |
| O | 7 | 1K | ✓ | x |
| P | 8 | 5K | x | ✓ |
| Q | 5 | 5K | x | ✓ |

The vehicle electrical systems VS are ranked to determine the priority ratings, for example based on their perceived importance to a user of the vehicle 2. In the arrangement illustrated in the look-up table T1, the vehicle electrical system VS having the highest priority has a priority rating of 1; and the vehicle electrical system VS having the lowest priority has a priority rating of 17. The low voltage vehicle electrical system VSLV having the highest priority rating is system A; and the low voltage vehicle electrical system VSLV having the lowest priority rating is system E. The low voltage vehicle electrical systems VSLV are activated in the sequence A, O, I, J, E; and de-activated in the sequence E, J, I, O, A. The high voltage vehicle electrical system VSHV having the highest priority rating is system C; and the high voltage vehicle electrical system VSHV having the lowest priority rating is system K. The high voltage vehicle electrical systems VSHV are activated in the sequence C, B, D, Q, N, P, M, L, H, G, F, K; and de-activated in the sequence K, F, G, H, L, M, P, N, Q, D, B, C.

In the illustrated arrangement, the combined power requirement of the vehicle electrical systems VS on the low voltage network NLV is 6 kW. If a user requests that all of the low voltage vehicle electrical systems VSLV are activated, the low voltage network NLV will be saturated. The electronic processor 11 is configured to control the vehicle electrical systems VS to enable activation of those systems having the highest priority. If systems E and J are disabled, the DC-DC converter 6 can supply the systems I, O and A having a combined power supply of 3 kW. The user may also request activation of one of the high voltage vehicle electrical systems VSHV, such as system K which has a priority rating of 16. Provided there is available capacity on the high voltage network NHV, the electronic processor 11 can activate the system K even though it has a priority rating which is lower than the system I (which has been disabled since the low voltage network NLV is saturated).

The priority ratings of the high and low voltage vehicle electrical systems VSHV, VSLV are defined in the same look-up table T1. This facilitates control of the high and low voltage vehicle electrical systems VSHV, VSLV. Moreover, changes to the architecture of the electrical systems may be implemented more readily. For example, in a different vehicle, the system E may be moved from the low voltage network NLV to the high voltage network NHV. In the above example, the user may request activation of the systems E, J, I, O, A, but in the modified architecture, system E is now enabled since it draws power from the high voltage network NHV. Furthermore, on the low voltage network NLV, the systems A, I and O are activated drawing a combined power of 3 kW. The electronic processor 11 inhibits operation of the system J since it has the lowest priority rating and its activation would result in the DC-DC converter 6 being saturated.

The electrical load management system 1 controls the high and low voltage networks networks NHV, NLV having separate power sources and several vehicle electrical systems VS spread across both networks NHV, NLV. Each vehicle electrical system VS, irrespective of whether it is on the high voltage network NHV or the low voltage network NLV, is enabled in a predetermined order, provided the power source for the network NHV, NLV associated with that vehicle electrical system VS has capacity to deliver the required power. If one of the networks NHV, NLV is saturated and cannot deliver the power required for all of the requested vehicle electrical systems VS on that network, the un-saturated network can continue to operate and power vehicle electrical systems VS on that network. Moreover, the vehicle electrical systems VS operating on the un-saturated network may be enabled even though they have a lower priority rating than vehicle electrical systems VS which have been de-activated on the saturated network NHV, NLV.

The electronic processor 11 deals with the non-linearity created by the saturation of the DC-DC converter 6 by shifting the functional priority of operation to the vehicle electrical systems VS which can receive power. The electronic processor 11 may also implement timed requests which alter the predetermined priority order of operation. For example, if the electronic processor 11 identifies a vehicle electrical system VS which has not operated for a predetermined period of time, another higher priority vehicle electrical system VS may be switched off to enable the identified vehicle electrical system VS to function for a predetermined period of time. The priority of the aforementioned low voltage vehicle electrical systems VSLV are set out in table T2 below.

TABLE T2

Manageable Load Priority Table According to Function

| Priority | Manage OFF | Manage ON | Manage ON (Timing) |
|---|---|---|---|
| 1 | Cabin electric heater (Positive Temperature Coefficient) | Heated Steering Wheel (HSW) | Heated Steering Wheel (HSW) |
| 2 | Heated (Climatic) Seats (HS) | Heated Front Screen (HFS) | Heated Front Screen (HFS) |
| 3 | Heated Wiper Pack (HWP) | Heated Mirrors (HM) | Cabin electric heater (Positive Temperature Coefficient) |
| 4 | Heated Rear Screen (HRS) | Heated Rear Screen (HRS) | Heated Rear Screen (HRS) |
| 5 | Heated Mirrors (HM) | Heated Wiper Pack (HWP) | Heated Mirrors (HM) |
| 6 | Heated Front Screen (HFS) | Heated (Climatic) Seats (HS) | Heated Wiper Pack (HWP) |
| 7 | Heated Steering Wheel (HSW) | Cabin electric heater (Positive Temperature Coefficient) | N/A Climatic seats are not part of this function |

In use, a command signal is generated when a user requests activation of a vehicle electrical system VS. When the electronic processor 11 receives the command signal to activate a requested vehicle electrical system VS, the electronic processor 11 determines whether the available current on the appropriate high or low voltage network NHV, NLV is sufficient to power that vehicle electrical system VS in view of the current electrical load on that network NHV, NLV as a result of the active vehicle electrical systems VS. If the required current to power the vehicle electrical system VS is less than the available current, the electronic processor 11 activates the requested vehicle electrical system VS. If the required current to power the vehicle electrical system VS is greater than the available current, the electronic processor 11 compares the priority rating of the active vehicle electrical systems VS to the priority rating of the requested vehicle electrical systems VS. If the priority rating of the requested vehicle electrical system VS is lower than that of the active vehicle electrical system(s) VS, the electronic processor 11 does not activate the requested vehicle electrical system VS. If the priority rating of the requested vehicle electrical system VS is higher than that of one or more active vehicle electrical systems VS, the electronic processor 11 de-activates an active vehicle electrical system VS having a lower priority rating. The electronic processor 11 may de-activate more than one active vehicle electrical system VS to provide sufficient capacity on that network NHV, NLV to enable activation of the requested vehicle electrical system VS. The reverse control strategy is applicable for re-activating vehicle electrical systems VS after they have been de-activated. When the output from the DC-DC converter 6 is saturated, the operation of the low voltage vehicle electrical systems VSLV is dependent on the existing load on the low voltage network NLV. The electronic processor 11 de-activates the low voltage vehicle electrical systems VSLV having the lowest priority. The electronic processor 11 may also determine if a charging current should be supplied to the low voltage battery 7. If a charging current is required by the low voltage battery 7, the total amount of available current to operate the vehicle electrical systems VS is reduced accordingly.

The electronic processor 11 has been described as either activating or de-activating the vehicle electrical systems VS. In a modified arrangement, the electronic processor 11 may control an operating state of one or more of said vehicle electrical system VS. For example, the electronic processor 11 may activate the vehicle electric system VS in a low-level operating state. The low-level operating state may be lower than that requested by the user in view of limitations in the available current on that network. The low-level operating state may be calibrated. Alternatively, or in addition, the electronic processor 11 may vary the operating state of one or more of said vehicle electrical system VS in dependence on the available current on the relevant network. The electronic processor 11 may thereby implement a variable management strategy in dependence on the available current.

The electrical load management system 1 allows the correct management of a power supply system PSS comprising a plurality of networks having different operating voltages. It provides this functionality whilst ensuring that the vehicle electrical systems VS operate according to a predefined priority. The priority may occasionally be altered to ensure everything is operated. Also, a new prioritization order has been added as a result of the non-linearity caused by the DC-DC converter 6.

It will be appreciated that various changes and modifications can be made to the invention described herein without departing from the scope of the present application.

The invention claimed is:

1. An electrical load management system for a vehicle power supply system (PSS) having a high voltage network (NHV) and a low voltage network (NL V) coupled to each other by a DC-DC converter, wherein the electrical load management system comprises:
   a controller for controlling vehicle electrical systems (VS), the vehicle electrical systems (VS) comprising one or more high voltage vehicle electrical system (VSHV) connected to the high voltage network (NHV) and one or more low voltage vehicle electrical system (VSLV) connected to the low voltage network (NLV), the vehicle electrical systems (VS) having a predefined order of priority;
   the controller comprising at least one processor for receiving command signals for the high and low voltage vehicle electrical systems (VSHV, VSLV);
   a memory device having instructions stored therein and coupled to the at least one processor;
   wherein the at least one processor is configured to:
   determine a first electrical load on the high voltage network (NHV) and a second electrical load on the low voltage network (NLV) in dependence on the command signals;
   cause activation of the high and low voltage vehicle electrical systems (VSHV, VSLV) in the order of priority; and
   if the activation of a next vehicle electrical systems (VS) according to the order of priority would cause the first electrical load or the second electrical load to respectively exceed a capacity of the high voltage network (NHV) or the low voltage network (NL V), shift priority of operation to a vehicle electrical system (VS) which can receive power.

2. The electrical load management system as claimed in claim 1, wherein each of the high and low voltage vehicle electrical systems (VSHV, VSLV) has a predefined electrical load value; and the at least one processor is configured to determine the first and second electrical loads in dependence on the predefined electrical load values.

3. The electrical load management system as claimed in claim 2, wherein the at least one processor is configured to receive the predefined electrical load value from a control module associated with the high and low voltage vehicle electrical systems (VSHV, VSL V).

4. The electrical load management system as claimed in claim 2, wherein the electrical load values of the high and low voltage vehicle electrical systems (VSHV, VSLV) are power ratings.

5. The electrical load management system as claimed in claim 4, wherein the capacity of the high voltage network comprises a first maximum power load and the capacity of the low voltage network comprises a second maximum power load; the at least one processor being configured to shift priority of operation to a vehicle electrical system (VS) which can receive power without causing the first and second electrical loads to exceed the first and second maximum power loads respectively.

6. The electrical load management system as claimed in claim 1, wherein the at least one processor is configured to determine when the DC-DC converter is saturated; and cause de-activation or to inhibit activation of one or more low voltage vehicle electrical system (VSLV) when the DC-DC converter is saturated.

7. The electrical load management system as claimed in claim 1, wherein the high and low voltage vehicle electrical systems (VSHV, VSLV) are categorized as manageable and unmanageable, the at least one processor being configured to prioritize operation of the unmanageable high and low voltage vehicle electrical systems (VSHV, VSLV) over the manageable high and low voltage vehicle electrical systems (VSHV, VSLV).

8. The electrical load management system as claimed in claim 1, wherein one of the low voltage vehicle electrical systems (VSLV) is a low voltage battery, the at least one processor being configured to control charging of the low voltage battery.

9. The electrical load management system as claimed in claim 1, wherein one of the high voltage vehicle electrical systems (VSHV) is a high voltage battery, the at least one processor being configured to control charging of the high voltage battery.

10. A vehicle comprising the electrical load management system as claimed in claim 1.

11. A method of managing electrical load on a vehicle power supply system (PSS) having a high voltage network and a low voltage network coupled to each other by a DC-DC converter, the method comprising:
    controlling vehicle electrical systems (VS), the vehicle electrical systems (VS) comprising one or more high voltage vehicle electrical system (VSHV) connected to the high voltage network (NHV) and one or more low voltage vehicle electrical system (VSLV) connected to the low voltage network (NV), the vehicle electrical systems (VS) having a predefined order of priority;
    receiving command signals for the high and low voltage vehicle electrical systems (VSHV, VSLV);
    determining a first electrical load on the said high voltage network (NHV) and a second electrical load on the said low voltage network (NLV) in dependence of the said command signals; and
    causing activation controlling operation of the high and low voltage vehicle electrical systems (VSHV, VSLV) in dependence on the determined first and second electrical loads the order of priority; and
    if the activation of a next vehicle electrical systems (VS) according to the order of priority would cause the first electrical load or the second electrical load to respectively exceed a capacity of the high voltage network (NHV) or the low voltage network (NL V), shifting priority of operation to a vehicle electrical system (VS) which can receive power.

12. The method as claimed in claim 11, further comprising determining the first and second electrical loads in dependence on electrical load values defined for each of the high and low voltage vehicle electrical systems (VSHV, VSLV).

13. The method as claimed in claim 12, wherein the electrical load values of the high and low voltage vehicle electrical systems (VSHV, VSLV) are power ratings.

14. The method as claimed in claim 13, further comprising shifting priority of operation to a vehicle electrical systems (VS) which can receive power without causing the first and second electrical loads to exceed first and second maximum power loads defined for the high and low voltage networks respectively.

15. The method as claimed in claim 11, further comprising receiving the predefined electrical load values from a control module associated with each of the high and low voltage vehicle electrical systems (VSHV, VSLV).

16. The method as claimed in claim 11 further comprising causing de-activation or inhibiting activation of one or more low voltage vehicle electrical system (VSLV) when the DC-DC converter is saturated.

17. The method as claimed in claim 11, wherein the high and low voltage vehicle electrical systems (VSHV, VSL V) are categorized as manageable and unmanageable, the method comprising prioritizing operation of the unmanageable high and low voltage vehicle electrical systems (VSHV, VSLV) over the manageable high and low voltage vehicle electrical systems (VSHV, VSLV).

18. The method as claimed in claim 11, wherein one of the low voltage vehicle electrical systems is a low voltage battery, the method comprising controlling charging of the low voltage battery.

19. The method as claimed in claim 11, wherein one of the high voltage vehicle electrical systems is a high voltage battery, the method comprising controlling charging of the high voltage battery.

20. A non-transitory computer readable media comprising a set of computational instructions which, when executed, cause a computer to perform at least the following:
controlling vehicle electrical systems (VS), the vehicle electrical systems (VS) comprising one or more high voltage vehicle electrical system (VSHV) connected to the high voltage network (NHV) and one or more low voltage vehicle electrical system (VSL V) connected to the low voltage network (NL V), the vehicle electrical systems (VS) having a predefined order of priority;
receiving command signals for the high and low voltage vehicle electrical systems (VSHV, VSLV);
determining a first electrical load on the high voltage network (NHV) and a second electrical load on the low voltage network (NL V) in dependence on the command signals; and
causing activation of the high and low voltage vehicle electrical systems (VSHV, VSLV) in the order of priority; and
if the activation of a next vehicle electrical systems (VS) according to the order of priority would cause the first electrical load or the second electrical load to respectively exceed a capacity of the high voltage network (NHV) or the low voltage network (NL V), shifting priority of operation to a vehicle electrical system (VS) which can receive power.

\* \* \* \* \*